United States Patent
Suzuki et al.

(10) Patent No.: US 8,899,564 B2
(45) Date of Patent: Dec. 2, 2014

(54) COLORED CERAMIC VACUUM CHUCK AND MANUFACTURING METHOD THEREOF

(75) Inventors: Shigemi Suzuki, Kanagawa (JP); Kiyoka Suzuki, legal representative, Kanagawa (JP); Yoshiharu Ishimi, Ishikawa (JP); Hidekazu Motoya, Ishikawa (JP)

(73) Assignee: Sodick Co., Ltd., Kanagawa (JP)

( * ) Notice: Subject to any disclaimer, the term of this patent is extended or adjusted under 35 U.S.C. 154(b) by 771 days.

(21) Appl. No.: 13/202,329

(22) PCT Filed: Feb. 19, 2010

(86) PCT No.: PCT/JP2010/052553
§ 371 (c)(1),
(2), (4) Date: Mar. 2, 2012

(87) PCT Pub. No.: WO2010/095719
PCT Pub. Date: Aug. 26, 2010

(65) Prior Publication Data
US 2012/0193878 A1     Aug. 2, 2012

(30) Foreign Application Priority Data
Feb. 23, 2009    (JP) ................ 2009-038767

(51) Int. Cl.
| B25B 11/00 | (2006.01) |
| H01L 21/683 | (2006.01) |
| B65G 49/06 | (2006.01) |
| C04B 35/117 | (2006.01) |
| G03F 7/20 | (2006.01) |
| H01L 21/687 | (2006.01) |

(52) U.S. Cl.
CPC .......... *H01L 21/6838* (2013.01); *B65G 49/061* (2013.01); *C04B 35/117* (2013.01); *G03F 7/707* (2013.01); *G03F 7/70941* (2013.01); *G03F 7/7095* (2013.01); *H01L 21/6875* (2013.01); *B65G 2249/045* (2013.01); *C04B 2235/3206* (2013.01); *C04B 2235/3208* (2013.01); *C04B 2235/3222* (2013.01); *C04B 2235/3232* (2013.01); *C04B 2235/3234* (2013.01); *C04B 2235/3241* (2013.01); *C04B 2235/3262* (2013.01); *C04B 2235/3272* (2013.01); *C04B 2235/3277* (2013.01); *C04B 2235/3418* (2013.01); *C04B 2235/3481* (2013.01); *C04B 2235/72* (2013.01); *C04B 2235/80* (2013.01); *C04B 2235/94* (2013.01); *C04B 2235/945* (2013.01); *C04B 2235/96* (2013.01); *C04B 2235/963* (2013.01); *C04B 2235/9661* (2013.01)
USPC ........................................ 269/21; 269/289 R

(58) Field of Classification Search
USPC ............... 269/21, 20, 289 R, 302.1, 900, 903
See application file for complete search history.

(56) References Cited

U.S. PATENT DOCUMENTS 5,272,897 A * 12/1993 Wern ............................ 72/53
6,964,812 B2 * 11/2005 Ito et al. .................... 428/408

(Continued)

FOREIGN PATENT DOCUMENTS

| JP | H03-202246 | 9/1991 |
| JP | 05-205997 | 8/1993 |

(Continued)

*Primary Examiner* — Lee D Wilson
(74) *Attorney, Agent, or Firm* — Jianq Chyun IP Office

(57) ABSTRACT

In the present invention, a ceramic vacuum chuck 2 having an upper surface for adsorbing a substrate is formed from a colored ceramic sintered body comprising 55-75% by weight alumina ($Al_2O_3$), at least 3% by weight Si in terms of oxide ($SiO_2$), at least 0.4% by weight Ca in terms of oxide (CaO), at least 0.4% by weight Mg in terms of oxide (MgO), coloring agent, and 1% or less of impurities. A plurality of pins 4 for supporting the substrate, and a rim 6 are formed on the upper surface by shot blasting using abrasive grains, and the whole of the upper surface is shot peened using spherical particles.

10 Claims, 1 Drawing Sheet

(56) References Cited

U.S. PATENT DOCUMENTS

| | | | |
|---|---|---|---|
| 2011/0187063 A1* | 8/2011 | Shim | 279/142 |
| 2012/0018938 A1* | 1/2012 | Cone et al. | 269/21 |
| 2012/0146273 A1* | 6/2012 | Tiefenbock et al. | 269/21 |
| 2012/0193878 A1* | 8/2012 | Suzuki et al. | 279/3 |
| 2013/0022738 A1* | 1/2013 | Deng et al. | 427/162 |
| 2013/0200559 A1* | 8/2013 | Asada | 269/21 |

FOREIGN PATENT DOCUMENTS

| | | |
|---|---|---|
| JP | H08-139168 | 5/1996 |
| JP | 2004099413 | 4/2004 |
| JP | 2004-358331 | 12/2004 |
| JP | 2005109091 | 4/2005 |
| JP | 2005332910 | 12/2005 |
| JP | 2006210546 | 8/2006 |

* cited by examiner

COLORED CERAMIC VACUUM CHUCK AND MANUFACTURING METHOD THEREOF

CROSS-REFERENCE TO RELATED APPLICATION

This application is a 371 of international application of PCT application Ser. No. PCT/JP2010/052553, filed on Feb. 19, 2010, which claims the priority benefit of Japan application no. 2009-038767, filed on Feb. 23, 2009. The entirety of each of the above-mentioned patent applications is hereby incorporated by reference herein and made a part of this specification.

FIELD OF THE INVENTION

The present invention relates to an exposure device for exposing a glass substrate in a process for manufacturing an FPD such as an LCD (liquid crystal display) or PDP (plasma display). In particular, the present invention relates to a colored ceramic vacuum chuck on which a glass substrate is mounted.

BACKGROUND

Incident light in an ultraviolet region used in an exposure process would pass through a glass substrate and is undesirably reflected off an upper surface of a vacuum chuck. Since this reflected light causes irregularities in exposure, low reflectance is desired of the vacuum chuck. Within the incident light, a proportion of light that is reflected at the same angle as the incident angle is called regular reflection, or specular reflection. It can be expected that if the surface roughness of the upper surface of the vacuum chuck becomes large, regular reflection will become small. Patent documents 1-3 disclose substrate holding devices that lower regular reflection by roughening a vacuum chuck upper surface. However, roughening sometimes makes diffuse reflection larger. An amount of reflection with diffuse reflection added to regular reflection is called total reflectance or cumulative reflectance. In particular, exposure devices for LCDs of recent years aim for low total reflectance.

In general, a vacuum chuck is formed from black anodized aluminum, or ceramics. Patent document 4 describes that total reflectance of black anodized aluminum is 6-8% in the 200 nm to 650 nm light wavelength range. However, a black and thin-film is subjected to abrasion or peel-off due to repeated chucking of a glass substrate. Also, finish machining process for the vacuum chuck after the black anodizing process has limitations in terms of protecting the black thin-film. Further, uniformly forming a darkened thin-film on a large vacuum chuck is not a simple matter.

Patent document 5 discloses colored alumina ceramics appropriate to a support platform for large meter-size substrates. Regular reflectance of the disclosed appropriate colored ceramics is 0.6-0.9% for light wavelengths of 220-350 nm, while total reflectance is 10.3-22.5% for light wavelengths of 220-350 nm.

In many cases, numerous protruding pins for supporting a glass substrate are formed on the vacuum chuck in order to make the surface area of the vacuum chuck that contacts the glass substrate small. A number of vacuum vents communicating with a vacuum source are formed in a non-contact surface of the vacuum chuck. In order to improve vacuum efficiency a space formed between the non-contact surface and the glass substrate is partitioned by a protruding rim. The rim is also called a bank or dike. The vacuum vents and most of the pins are enclosed by the rim. The rim normally has almost the same height as the pins.

Normally, the pins and the rim are formed using shot blasting following formation of a mask pattern. Hard abrasive grains, such as green carborundum and white alundum, which contain alumina ($Al_2O_3$), silicon carbide (SiC), silicone nitride ($Si_3N_4$) or Zirconia ($ZrO_2$) as a main component are used in the shot blasting. Depressed area formed in this way is different in total reflectance from the protruding areas. Also, even for the same protruding areas total reflectance of the rim will be slightly higher than that of the pins due to differences in surface area ratios of projections with respect to peripheral depressed area.

PRIOR ART DOCUMENTS

Patent Documents

Patent Document 1: Japanese patent laid open No. 2005-332910
Patent Document 2: Japanese patent laid open No. 2005-109091
Patent Document 3: U.S. Pat. No. 3,095,514
Patent Document 4: Japanese patent laid open No. 2006-210546
Patent Document 5: Japanese patent laid open No. 2004-099413

SUMMARY OF THE INVENTION

An object of the present invention is to provide a low reflectance vacuum chuck for supporting a large glass substrate of one square meter size. A vacuum chuck is therefore manufactured from a colored ceramic sintered body having high Young's modulus. Another object of the present invention is to provide a colored ceramic vacuum chuck having a sufficiently low total reflectance even if a colored film is not formed, and in particular with regard to total reflectance having a sufficient competitive edge over a black anodized aluminum vacuum chuck. A further object of the present invention is to provide a colored ceramic vacuum chuck having uniform total reflectance for placement surfaces on which pins and a rim are formed.

According to one aspect of the present invention, a ceramic vacuum chuck having an upper surface for adsorbing a substrate is formed from a colored ceramic sintered body comprising 55-75% by weight alumina ($Al_2O_3$), at least 3% by weight Si in terms of oxide ($SiO_2$), at least 0.4% by weight Ca in terms of oxide (CaO), at least 0.4% by weight Mg in terms of oxide (MgO), coloring agent, and 1% or less of impurities, wherein a plurality of pins for supporting the substrate, and a rim at least partially enclosing the plurality of pins, are formed on the upper surface by shot blasting using abrasive grains, and the whole of the upper surface is shot peened using spherical particles.

The ceramic vacuum chuck of the present invention has a Young's modulus of 200 GPa or more. Also, the ceramic vacuum chuck of the present invention has a total reflectance at a light wavelength of 360 nm of 7% or less when light is reflected on the upper surface.

The coloring agent may be selected from Fe, Mn, Co, Ti and Cr. Preferably, the coloring agent contains 2-20% by weight of Fe in terms of oxide ($Fe_2O_3$).

Shot peening using spherical particles forms a plurality of microscopic strike marks on the upper surface of the vacuum chuck material. The spherical particles are preferably glass beads, and in particular glass beads having an average particle size of 10-25 µm. Also, the spherical particles may have a smaller specific weight or smaller particle size than the abrasive grains.

According to another aspect of the present invention, a method of manufacturing a vacuum chuck comprises a step of forming a ceramic sintered body having a flat upper surface by sintering a material including 55-75% by weight of alumina ($Al_2O_3$), a sintering agent, a coloring agent, and 1% or less of impurities at 1200-1450° C., a step of polishing the upper surface, a step of forming a plurality of pins and a rim at least partially enclosing the plurality of pins by shot blasting the upper surface using abrasive grains with alumina, silicon carbide, silicon nitride or zirconia as a main component, with a mask pattern formed on the upper surface, and a step of reducing the total reflectance of the upper surface to 7% or less at a light wavelength of 360 nm by shot peening the upper surface using glass beads.

According to the present invention, a ceramic vacuum chuck has a sufficient Young's modulus, and can support a large substrate of about one square meter. Additionally, since shot peening using spherical particles is carried out after the pins and the rim have been formed by shot blasting the upper surface of the colored ceramic sintered body using abrasive grains, the total reflectance of the upper surface becomes uniform. Also, if the spherical particles are made of glass beads, shot peening causes further reduction in the total reflectance of the upper surface of the colluded ceramic sintered body. As a result, the colored ceramic vacuum chuck off the present attention has a long life span.

BEST MODE FOR EMBODYING THE INVENTION

Figure 1:
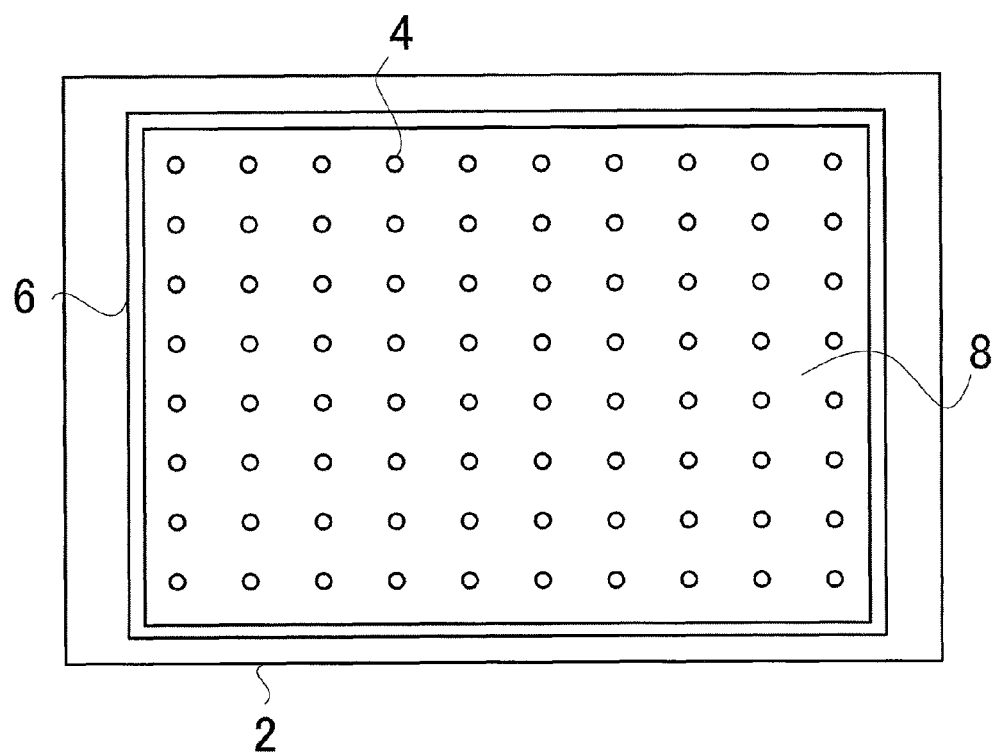
FIG. 1 is a plan view showing a ceramic vacuum chuck of the present invention.
Figure 2:
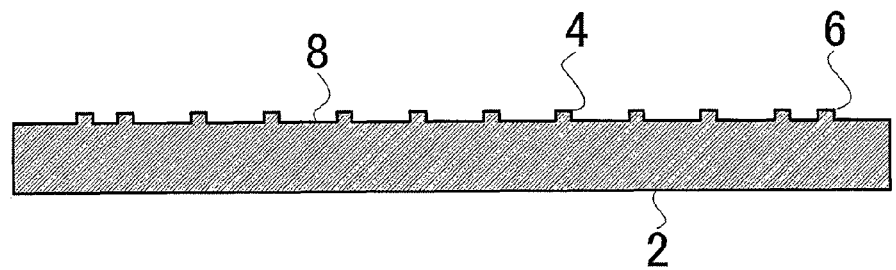
FIG. 2 is a cross-sectional view showing the ceramic vacuum chuck of the present invention.

One embodiment of a ceramic vacuum chuck of the present invention will be described with reference to FIG. 1 and FIG. 2. A plurality of pins 4 for supporting a glass substrate are formed on the upper surface of a vacuum chuck 2. The glass substrate contacts the flat top surfaces of the pins 4. A protruding rim 6 at least partially enclosing the plurality of pins 4 is also formed on the upper surface of the vacuum chuck 2. The rim 6 is rectangular along the contour of the vacuum chuck 2, and has the same or substantially the same height as the pins 4. A number of vacuum vents (not illustrated) communicating with a vacuum source are formed in a non-contact surface 8 that does not contact the substrate.

A ceramic vacuum chuck 2 is formed from a colored ceramic sintered body with alumina as a main component. If the ratio of alumina within the colored ceramic sintered body is smaller than 55% by weight, it is difficult to manufacture a vacuum chuck 2 having a sufficient Young's modulus. A sufficient Young's modulus is such that the vacuum chuck 2 supports a large substrate of about one square meter, and specifically is 200 GPa or more. Also, if the ratio of alumina contained within the current ceramic sintered body is larger than 75% by weight, the ratio of coloring agent and sintering agent becomes small and the ceramic sintered body will not exhibit a dark color.

The colored ceramic sintered body preferably contains 3-12% by weight of Si in terms of oxide ($SiO_2$). Also, the colored ceramic sintered body preferably contains at least 0.4% by weight of Ca in terms of oxide (CaO), and at least 0.4% by weight of Mg in terms of oxide (MgO). If the sintering agent is less than the desired range, the sintering temperature will become disadvantageously high.

The coloring agent included in the colored ceramic sintered body can be selected from Fe, Mn, Co, Ti and Cr. The coloring agent comprising 2-20% by weight of Fe in terms of oxide ($Fe_2O_3$) contributes to lowering of the regular reflectance. A ceramic raw material is sintered at a temperature of 1200-1450° C. A sintering furnace may be an electrical furnace or a high productivity LPG furnace.

A mask pattern corresponding to the plurality of pins 4 and the rim 6 is formed on the colored ceramic sintered body. Next, shot blasting the colored ceramic sintered body using abrasive grains is carried out. The abrasive grains are hard abrasive grains that can grind down an alumina ceramic sintered body. The hard abrasive grains for the shot blasting contain alumina ($Al_2O_3$), silicon carbide (SiC), silicone nitride ($Si_3N_4$) or Zirconia ($ZrO_2$) as a main component. The abrasive grains may be, for example, green carborundum (GC) or white carborundum (WC).

A requirement of the ceramic vacuum chuck of the present invention is shot peening the upper surface of the colored ceramic sintered body. Shot peening using microscopic spherical particles reduces differences in total reflectance of the pins 4, the rim 6 and the non-contact surface 8. Spherical particles used in the shot peening are preferably glass beads. Also, shot peening using glass beads causes about a further 1% reduction in the total reflectance of the upper surface of the colored ceramic sintered body. As a result, the total reflectance of the upper surface of the colored ceramic sintered body becomes 7% or less at a light wavelength of 360 nm. Even if a white ceramic sintered body was to be shot peened using glass beads, there would not be such a reduction in the total reflectance.

Table 1 shows samples of colored ceramic sintered bodies. Constituent elements of the samples are in terms of oxides. Manufacture of the samples of the colored ceramic sintered bodies will be described in the following. First, powder of manganese dioxide ($MnO_2$), ferric oxide ($Fe_2O_3$), silica or clay, dolomite ($MgCO_3.CaCO_3$), calcite ($CaCO_3$), magnesite ($MgCO_3$), chrome oxide ($Cr_2O_3$), and titanium oxide ($TiO_2$) is mixed after weighing with powder of alumina ($Al_2O_3$) as a main component. Next, slurry is prepared by wet milling of raw powder. The slurry is dried using a spray drying method and raw material granules are formed. After the raw material granules are press formed, they are sintered in an electrical furnace at a temperature of 1300-1450° C. In this manner, two samples of different size were manufactured for each sample number. Although not shown in table 1, cracks occurred in samples having an alumina content of 47% by weight or less.

TABLE 1

|  |  | Samples of colored ceramic sintered body | |
|---|---|---|---|
|  |  | Sample 1 | Sample 2 |
| Component (% by weight) | $Al_2O_3$ | 73.1-73.3 | 73.1 |
|  | $Fe_2O_3$ | 6.8 | 6.8 |
|  | MnO | 7-8.1 | 7 |
|  | MgO | 0.6 | 0.6 |
|  | $Co_3O_4$ | 1.5 | 1.5 |
|  | $Cr_2O_3$ | 1.5 | 1.5 |
|  | $SiO_2$ | 5.5-6.9 | 6.9 |
|  | CaO | 1.1 | 1.1 |
|  | $TiO_2$ | 1.2 | 1.2 |

TABLE 1-continued

|  | Samples of colored ceramic sintered body | |
| --- | --- | --- |
|  | Sample 1 | Sample 2 |
| Crystal phase   Mn•Al | ◯ | ◯ |
| Young's Modulus (GPa) | 203-208 | 220 |
| Specific weight | 3.329-3.344 | 3.6 |
| Sample dimensions | 150 mm square and 40 mm thick | 150 mm square and 40 mm thick |

Pieces of the samples were pulverized in a mortar, and crystal phase analysis was carried out using an X-ray diffractometer. As a result, the colored ceramic sintered body was comprised of alumina ($Al_2O_3$) crystals, spinel crystals, anorthite ($CaO.Al_2O_3.2SiO_2$) crystals, and a small amount of other crystal phases. Spinel crystals are any of Mn—Al spinel ($MnO.Al_2O_3$) crystals, Mg—Fe spinel ($MgFe^{3+}_2O_4$) crystals, or Mn—Mg—Fe—Al ($MnO.MgFe^{3+}_2O_4.Al_2O_3$) spinel crystals. Spinel crystals exhibit a red-brown color, black color or blackish brown color, and reduce total reflectance by absorbing light.

Young's modulus (GPa) in table 1 was measured using a resonance method defined in R1602 of the Japan Industrial Standards (JIS). Specific weight in table 1 is bulk specific weight obtained by measuring a 30 mm square and 20 mm thick sample using an Archimedian method. Embodiments of the present invention will be described in the following.

Embodiments

[Embodiment 1]

Upper and lower flat surfaces of a sample 1 were washed after grinding to a thickness of 30 mm with a particle size No. 325 diamond grind stone. Roughness of the ground surfaces of the sample 1 was 1.0-1.6 μmRa. Ground surfaces of the sample 1 had total reflectance at a light wavelength of 360 nm in a range of 6-10%, and regular reflectance in a range of 0.4-0.7%. Next, a mask pattern corresponding to a plurality of pins 4 and a rim 6 was formed on ground surfaces of the sample 1, and the sample 1 was subjected to shot blasting using alumina abrasive grains. Roughness of a non-contact surface 8 of the sample 1 was 1-5 μmRa. The non-contact surface 8 of the sample 1 had a total reflectance of over 7% at a light wavelength of 360 nm. As a result of alumina abrasive grain shot blasting, the total reflectance of the non-contact surface 8 became about 1% higher than that of the pins 4. Also, total reflectance of the rim 6 became about 1% higher than that of the pins 4, depending on the size of the pins 4 and the rim 6. Next, the upper surface of the sample 1 was subjected to shot peening using spherical particles. The spherical particles were #1200 glass beads, and the average particle diameter was made 10-25 μm. When observed with an electron microscope, a plurality of spherical strike marks were formed overlapping on the upper surface of the sample 1. The size of a spherical strike marks was the same as the spherical particles. The non-contact surface 8 of the sample 1 had a total reflectance of 6.1-6.5%, which is less than 7%, at a light wavelength of 360 nm. Differences in total reflectance of the pins 4, rim 6 and non-contact surface 8 were 0.5% or less.

[Embodiment 2]

Upper and lower flat surfaces of a sample 2 were washed after grinding to a thickness of 30 mm with a particle size No. 140 diamond grind stone. Roughness of the ground surface of the sample 2 was 0.8-0.9 μmRa. Ground surfaces of the sample 2 had total reflectance at a light wavelength of 360 nm in a range of 8.7-8.8%, and greater than 7%. Normal reflectance was 0.1-0.2% at a light wavelength of 360 nm. Next, the sample 2 was subjected to shot blasting using silicon carbide abrasive grains of particle size number 400 (as a result of this shot blasting, the surface of the sample 2 becomes a surface corresponding to the non-contact surface 8 of embodiment 1). Surface roughness became large at 1.4-1.5 μmRa. Total reflectance rose to 8.9-9.0% at a light wavelength of 360 nm. Regular reflectance was 0.1% or less at a light wavelength of 360 nm. Next, the upper surface of the sample 2 was subjected to shot peening using spherical particles. The spherical particles were glass beads and shot peening was carried out eight times under the conditions of table 2. When observed with an electron microscope, a plurality of spherical strike marks were formed overlapping on the upper surface of the sample 2. The size of the spherical strike marks was the same as the spherical particles. The surface roughness, which had become large immediately after grinding (before shot blasting), became slightly smaller compared to after shot blasting. Total reflectance was 6.5-6.6%, which is less than 7%, at a light wavelength of 360 nm. Regular reflectance was 0.1% or less at a light wavelength of 360 nm.

[Embodiment 3]

Upper and lower flat surfaces of a sample 2 were washed after being ground to a thickness of 30 mm with a particle size No. 325 diamond grind stone. Roughness of the ground surfaces of the sample 2 was 0.5-0.6 μmRa. Ground surfaces of the sample 2 had total reflectance at a light wavelength of 360 nm in a range of 8.0-8.1%, and greater than 7%. Normal reflectance was 0.2-0.3% a light wavelength of 360 nm. Next, the ground surfaces (surfaces corresponding to the pins 4 and the rim 6 of embodiment 1) of the sample 2 were subjected to shot peening using spherical particles. The spherical particles were glass beads, and shot peening was carried out four times under the conditions of table 2. When observed with an electron microscope, a plurality of spherical strike marks were formed overlapping on the upper surface of the sample 2. The size of the spherical strike marks was the same as the spherical particles. Surface roughness became large at 0.7-0.8 μmRa. Total reflectance was 6.6-6.8%, which is less than 7%, at a light wavelength of 360 nm. Regular reflectance was 0.1% or less at a light wavelength of 360 nm.

[Embodiment 4]

Ground surfaces of a sample 2 of embodiment 3 were subjected to shot peening a further four times using glass beads under the conditions of table 2. At 0.9-1.0 μmRa, surface roughness became larger compared to embodiment 3. Also, total reflectance was lowered further compared to embodiment 3, to 6.2-6.3%, at a light wavelength of 360 nm. Regular reflectance was 0.1% or less at a light wavelength of 360 nm.

[Embodiment 5]

Upper and lower flat surfaces of a sample 2 were washed after being ground to a thickness of 30 mm with a particle size No. 325 diamond grind stone, and hand lapping processing was carried out using lapping fluid containing diamonds of 3 μm particle size. Roughness of lapped surfaces of the sample 2 was 0.2-0.3 μmRa. The lapped surfaces of the sample 2 had total reflectance at a light wavelength of 360 nm of about 7.1%, and slightly greater than 7%. Regular reflectance was 0.9-1.0% or less at a light wavelength of 360 nm Next, the lapped surfaces of the sample 2 were subjected to shot peening using spherical particles. The spherical particles were glass beads and shot peening was carried out eight times under the conditions of table 2. When observed with an electron microscope, a plurality of spherical strike marks were formed overlapping on the upper surface of the sample 2. The size of the spherical strike marks was the same as the spherical particles. Surface roughness became large at 0.6-0.7

μmRa. Total reflectance was 6.4-6.6%, which is less than 7%, at a light wavelength of 360 nm. Regular reflectance was 0.4-0.5% at a light wavelength of 360 nm

TABLE 2

| Shot peening conditions | |
| --- | --- |
| Spherical particles | #1200 glass beads |
| Average particle size | 10-25 μm |
| Injection pressure | 0.4 MPa |

The invention claimed is:

1. A ceramic vacuum chuck having an upper surface for adsorbing a substrate, the ceramic vacuum chuck being formed from a colored ceramic sintered body comprising 55-75% by weight alumina, at least 3% by weight Si in terms of $SiO_2$, at least 0.4% by weight Ca in terms of CaO, at least 0.4% by weight Mg in terms of MgO, coloring agent, and 1% or less of impurities, wherein a plurality of pins for supporting the substrate, and a rim at least partially enclosing the plurality of pins, are formed on the upper surface by shot blasting using abrasive grains, and the whole of the upper surface is shot peened using spherical particles.

2. The vacuum chuck according to claim 1, wherein the ceramic vacuum chuck has a Young's modulus of 200 GPa or more.

3. The vacuum chuck according to claim 1, wherein a total reflectance is 7% or less at a light wavelength of 360 nm when light is reflected on the upper surface.

4. The vacuum chuck according to claim 1, wherein the coloring agent is selected from Fe, Mn, Co, Ti and Cr.

5. The vacuum chuck according to claim 4, wherein the coloring agent contains 2-20% by weight of Fe in terms of $Fe_2O_3$.

6. The vacuum chuck according to claim 1, wherein the spherical particles are glass beads.

7. The vacuum chuck according to claim 6, wherein the spherical particles are glass beads having an average particle size of 10-25 μm.

8. The vacuum chuck according to claim 1, wherein the spherical particles have a smaller particle size than the abrasive grains.

9. A method of manufacturing colored ceramic vacuum chuck comprising the steps of:
    forming a ceramic sintered body having a flat upper surface by sintering a material including 55-75% by weight of alumina, a sintering agent, a coloring agent, and 1% or less of impurities at 1200-1450° C.,
    polishing the upper surface,
    forming a plurality of pins and a rim at least partially enclosing the plurality of pins by shot blasting the upper surface using abrasive grains with alumina, silicon carbide, silicon nitride or zirconia as a main component, with a mask pattern formed on the upper surface, and
    reducing the total reflectance of the upper surface to 7% or less at a light wavelength of 360 nm by shot peening the upper surface using glass beads.

10. The method of manufacturing colored ceramic vacuum chuck according to claim 9, wherein the glass beads have an average particle size of 10-25 μm.

* * * * *